(12) United States Patent
Ruh

(10) Patent No.: US 9,891,100 B2
(45) Date of Patent: Feb. 13, 2018

(54) ELECTRONIC DEVICE HAVING LIGHT SENSOR PACKAGE WITH DIFFUSER FOR REDUCED LIGHT SENSOR DIRECTIONALITY

(71) Applicant: Apple Inc., Cupertino, CA (US)

(72) Inventor: Richard Ruh, Monte Sereno, CA (US)

(73) Assignee: Apple, Inc., Cupertino, CA (US)

( * ) Notice: Subject to any disclaimer, the term of this patent is extended or adjusted under 35 U.S.C. 154(b) by 470 days.

(21) Appl. No.: 14/051,207

(22) Filed: Oct. 10, 2013

(65) Prior Publication Data
US 2015/0102212 A1    Apr. 16, 2015

(51) Int. Cl.
| | | |
|---|---|---|
| G01J 1/04 | (2006.01) | |
| H01L 31/0203 | (2014.01) | |
| G02B 5/02 | (2006.01) | |
| G01J 1/42 | (2006.01) | |
| H01L 31/0232 | (2014.01) | |

(52) U.S. Cl.
CPC .......... *G01J 1/0474* (2013.01); *G01J 1/0403* (2013.01); *G01J 1/4204* (2013.01); *G02B 5/0231* (2013.01); *H01L 31/0203* (2013.01); *H01L 31/02327* (2013.01)

(58) Field of Classification Search
CPC .......... G01J 1/4204; G01J 1/04; G01J 1/0407; G01J 1/0474; G02B 5/0231; G02B 5/021; G02B 5/02; H01L 31/02327
USPC .......... 250/216, 214 AL, 239; 359/599, 707; 348/602, 603; 356/218; 340/600
See application file for complete search history.

(56) References Cited

U.S. PATENT DOCUMENTS

| | | | | |
|---|---|---|---|---|
| 3,274,392 A | * | 9/1966 | Harling | F21V 23/04 250/227.11 |
| 3,459,834 A | * | 8/1969 | Joseph | B32B 15/08 525/199 |
| 4,411,521 A | * | 10/1983 | Jourdan | G01J 1/04 250/216 |
| 5,153,429 A | * | 10/1992 | Takahashi | G01J 1/04 250/216 |
| 5,289,002 A | | 2/1994 | Tarn | |

(Continued)

FOREIGN PATENT DOCUMENTS

| | | | |
|---|---|---|---|
| JP | 2001264162 A | * | 9/2001 |
| WO | 2010120650 | | 10/2010 |

*Primary Examiner* — Que T Le
*Assistant Examiner* — Jennifer Bennett
(74) *Attorney, Agent, or Firm* — Treyz Law Group, P.C.; G. Victor Treyz; Zachary D. Hadd

(57) ABSTRACT

An electronic device display may have a display cover layer. The cover layer may have a border that has an opaque masking material with an opening defining a light window for an ambient light sensor. The ambient light sensor may have a photodetector mounted in a light sensor housing. A molded clear plastic light diffuser may be used to diffuse light for the ambient light sensor that is passing through the light window. The light diffuser may reduce directionality in the ambient light sensor. The light diffuser may have an array of molded protrusions such as flat-topped cones. Alignment features may be formed in the light sensor housing and the light diffuser. Clips and other molded structures for attaching the light sensor to a mounting bracket or other structures may be molded into the light diffuser and light sensor housing.

17 Claims, 21 Drawing Sheets

(56) References Cited

U.S. PATENT DOCUMENTS

| | | | | |
|---|---|---|---|---|
| 5,434,407 A * | 7/1995 | Bauer | ............ | B60R 1/088 250/227.24 |
| 5,462,700 A * | 10/1995 | Beeson | ............ | B29D 11/00663 264/1.27 |
| 6,389,687 B1 * | 5/2002 | Glenn | ............ | H01L 21/50 257/E21.499 |
| 6,466,312 B1 * | 10/2002 | Li | ............ | G01J 1/04 356/218 |
| 7,084,941 B2 * | 8/2006 | Suen | ............ | G02F 1/133615 349/113 |
| 7,245,794 B2 * | 7/2007 | Ishizaka | ............ | G02B 6/4201 385/14 |
| 7,543,946 B2 * | 6/2009 | Ockerse | ............ | B60R 1/088 250/216 |
| 7,560,676 B2 * | 7/2009 | Moon | ............ | G01J 1/06 250/203.4 |
| 8,319,764 B2 * | 11/2012 | Lee | ............ | G01J 1/04 345/207 |
| 8,339,526 B2 * | 12/2012 | Minikey, Jr. | ............ | B60R 1/12 349/11 |
| 8,963,062 B2 * | 2/2015 | Sasaki | ............ | B60H 1/0075 250/203.4 |
| 2010/0213041 A1 * | 8/2010 | Chen | ............ | H01H 13/705 200/314 |
| 2011/0188178 A1 | 8/2011 | Myers et al. | | |
| 2011/0279015 A1 * | 11/2011 | Negley | ............ | F21K 9/137 313/501 |
| 2012/0165759 A1 | 6/2012 | Rogers et al. | | |
| 2012/0170284 A1 * | 7/2012 | Shedletsky | ............ | G02F 1/13318 362/355 |
| 2012/0292630 A1 * | 11/2012 | Wu | ............ | H01L 33/32 257/76 |
| 2013/0032704 A1 * | 2/2013 | Fish, Jr. | ............ | H01L 31/02325 250/234 |

* cited by examiner

ELECTRONIC DEVICE HAVING LIGHT SENSOR PACKAGE WITH DIFFUSER FOR REDUCED LIGHT SENSOR DIRECTIONALITY

BACKGROUND

This relates generally to light sensors and, more particularly, to structures for diffusing light for light sensors in electronic devices.

Electronic devices often include light sensors. For example, light sensors can be used to make ambient light measurements. An electronic device may use ambient light data to control display brightness under a variety of ambient lighting conditions.

If care is not taken, ambient light sensors may exhibit different sensitivities for incoming light from different directions. This directionality is generally not desired in an ambient light sensor, as it can make a device overly sensitive to its orientation relative to concentrated light sources rather than being responsive to the overall level of ambient light in the vicinity of the sensor.

To reduce directionality, an ambient light sensor may be provided with a diffuser. The diffuser is typically formed from a polymer film that is coated with acrylic beads. The film is attached to the ambient light sensor using pressure sensitive adhesive, which can lead to assembly challenges due to potential misalignment during attachment, difficulty in removing backing material from the pressure sensitive adhesive, and other handling issues.

It would therefore be desirable to be able to provide improved ways to diffuse light for a light sensor within an electronic device.

SUMMARY

An electronic device may be provided with a display having a display cover layer. The display may have a central rectangular active area surrounded by a ring-shaped inactive border area. The underside of the display cover layer in the inactive border area may be coated with an opaque masking material such as black ink. An opening may be formed in the opaque masking material to define a light window for incoming ambient light.

An ambient light sensor may be mounted within the electronic device in alignment with the light window to receive and measure the incoming ambient light. The light sensor may have a photodetector mounted in a light sensor housing. A molded clear plastic light diffuser may be used to diffuse light that is entering the light sensor housing through the light window and that is passing to the photodetector. The light diffuser may reduce the directionality of the ambient light sensor.

The light diffuser may be formed using compression molding techniques or injection molding techniques. During molding, light scattering features such as bumps, pits, ribs, and channels may be molded into the plastic of the light diffuser. For example, an array of light scattering features such as an array of flat-topped protrusions or an array of flat-bottomed depressions may be formed. The light scattering features may by rotationally symmetric features such as flat-topped cones to help minimize directionality.

The light diffuser may be overmolded over the light sensor housing. Alignment features may be formed in the light sensor housing and the diffuser and clips and other molded structures for attaching the light sensor to a mounting bracket or other support structures may be molded into the light diffuser and light sensor housing.

DETAILED DESCRIPTION

Electronic devices may be provided with light sensors. Light sensors may be used in proximity sensors, as stand-alone ambient light sensors, as optical input devices, as part of multi-sensor arrays, or in other portions of an electronic device. Configurations in which a light sensor is used as an ambient light sensor in an electronic device are sometimes described herein as an example. This is, however, merely illustrative. Light sensors may be used for any suitable application in an electronic device.

Figure 1:
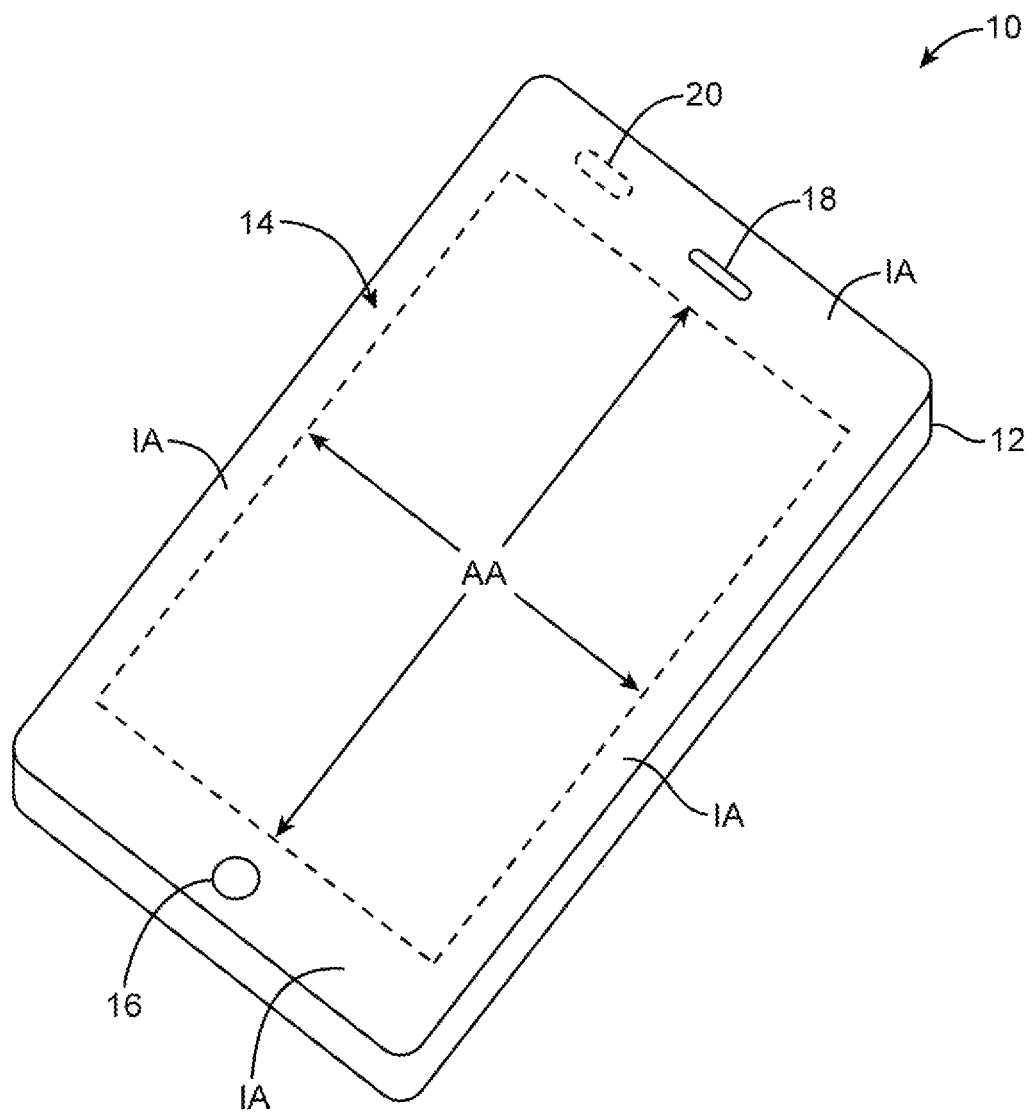
FIG. 1 is a perspective view of an illustrative electronic device such as a handheld computing device of the type that may be provided with one or more light sensors in accordance with an embodiment.

An illustrative electronic device of the type that may be provided with a light sensor is shown in FIG. 1. An electronic device such as electronic device 10 of FIG. 1 may be computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable display pixel structures such as organic light-emitting diode display pixels, electrophoretic display pixels, plasma display pixels, etc. The display pixels may be arranged in an array having numerous rows and columns to form rectangular active area AA of FIG. 1. Rectangular active area AA may be located in the center of device 10 and may be surrounded by inactive border regions such as inactive area IA.

A display cover layer may cover the surface of display 14 or a display layer such as a color filter layer (e.g., a layer formed from a clear substrate covered with patterned color filter elements) or other portion of a display may be used as the outermost (or nearly outermost) layer in display 14. The outermost display layer may be formed from a transparent glass sheet, a clear plastic layer, or other transparent member. To hide internal components from view, the underside of the outermost display layer or other display layer surface in inactive area IA may be coated with an opaque masking layer such as a layer of black ink. If desired, openings may be formed in the outermost layer of display 14 (e.g., in inactive area IA) to accommodate components such as button 16 and speaker port 18 of FIG. 1 (as examples). Buttons, connector ports, and other structures may also be accommodated using openings in housing 12.

One or more light sensors may be incorporated into device 10. For example, light sensors may be mounted behind openings in the sidewalls or rear wall of housing 12. As shown in FIG. 1, display 14 may have a region within inactive area IA such as area 20 under which one or more light sensors may be mounted. The opaque masking layer in area 20 may, if desired, be provided with a light window (e.g., an opening in the black ink layer or other light-transmitting window structure). The light window may allow light to pass through display 14 to reach a light sensor that is mounted within housing 12 in alignment with the light window. If desired, a light window for a light sensor may be formed from a laser-drilled hole or other opening in housing 12 or other portions of device 10.

Figure 2:
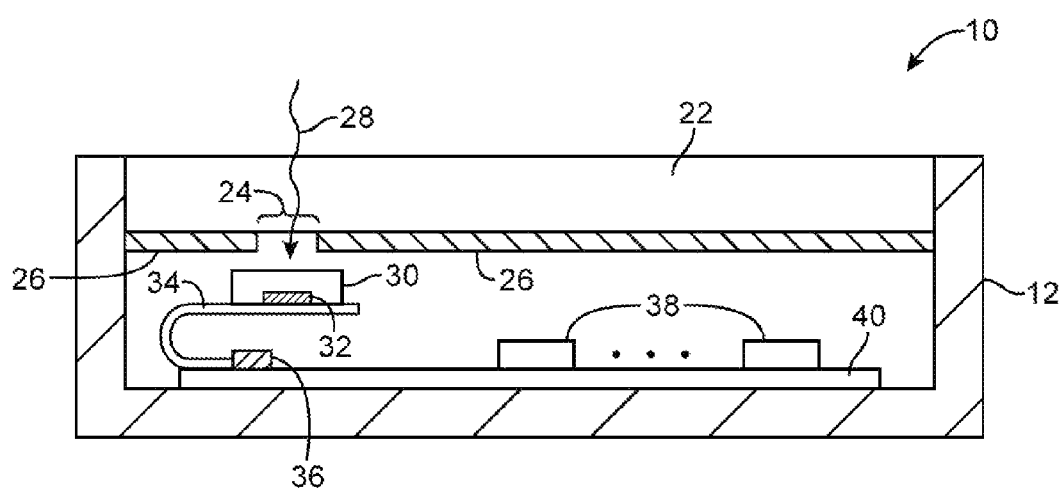
FIG. 2 is a cross-sectional side view of an illustrative electronic device of the type shown in FIG. 1 showing how the electronic device may be provided with an ambient light sensor in accordance with an embodiment.

A cross-sectional side view of electronic device 10 of FIG. 1 is shown in FIG. 2. The cross-section of FIG. 2 is taken through a portion of inactive area IA containing window region 20 of FIG. 1. As shown in FIG. 2, the underside of display cover layer 22 may be provided with a layer of opaque masking material 26 such as black ink. Black ink 26 may be patterned to form a rectangular opening to permit light from the array of display pixels in active area AA to escape outwards from the front face of device 10. Black ink 26 may also be patterned to form light window 24. Light sensor 30 may be aligned with light window 24, so that light 28 that passes through light window 24 can be measured.

Light sensor 30 may have a housing. The housing may be formed from plastic, metal, or other materials. A light sensitive electrical component such as photodetector 32 may be mounted within the bottom portion of the light sensor housing. Photodetector 32 is a semiconductor device (e.g., a silicon device) that senses light and produces a corresponding electrical signal that can be processed by control circuitry within device 10.

Electrical contacts associated with photodetector 32 and light sensor 30 may be soldered to a printed circuit such as flexible printed circuit 34. Flexible printed circuit 34 may be attached to printed circuit board connector 36. Printed circuit board connector 36 may be coupled to metal signal line traces within printed circuit 40. Printed circuit 40 may be a rigid printed circuit board (e.g., a printed circuit formed from fiberglass-filled epoxy) or may be a flexible printed circuit (e.g., a flex circuit formed from a sheet of polyimide or other flexible polymer layer).

Electrical components 38 may be mounted on printed circuit board 40. Components 38 may include integrated circuits, connectors, sensors, light-emitting components, audio components, discrete devices such as inductors, capacitors, and resistors, switches, and other electrical devices. If desired, light sensor 30 may be mounted on other substrates (e.g., a rigid printed circuit board, an injection molded plastic substrate with conductive traces, a layer of ceramic or glass, or other substrate). The configuration of FIG. 2 in which light sensor 30 has been mounted to flexible printed circuit 34 is merely illustrative.

Figure 3:
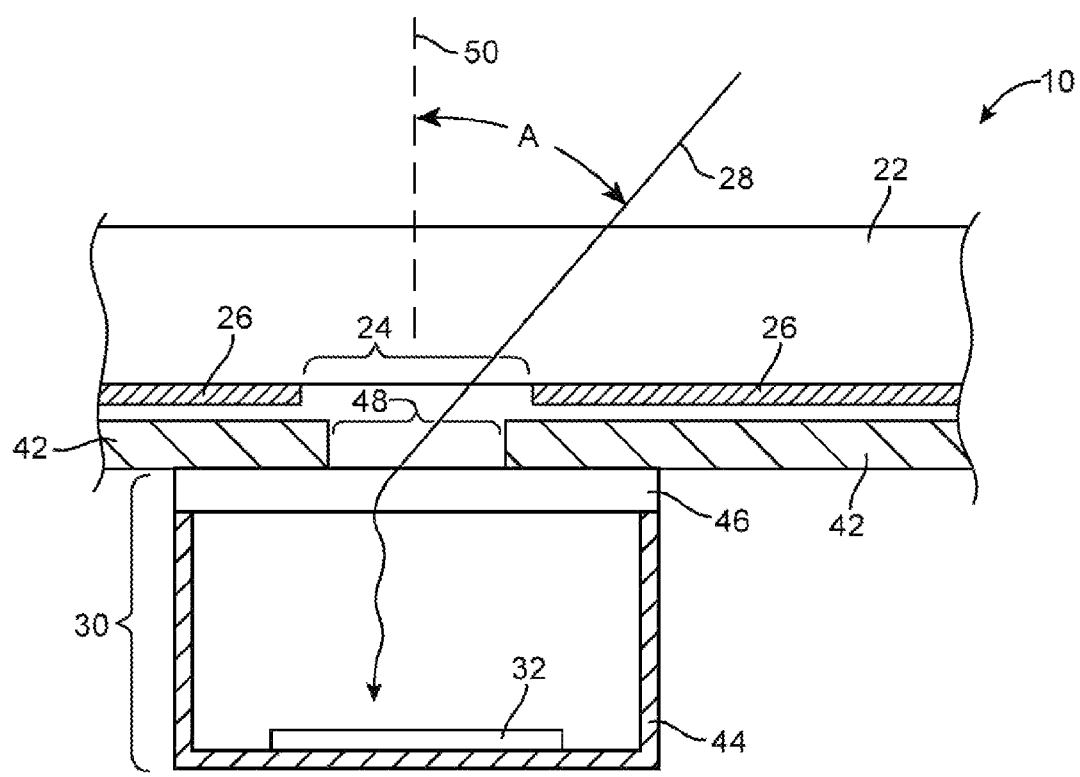
FIG. 3 is a cross-sectional side view of a portion of an electronic device that has a light sensor such as an ambient light sensor in which light is being diffused into the light sensor in accordance with an embodiment.

As shown in FIG. 3, light sensor 30 may be used to gather and measure off-axis ambient light 28. Off-axis light is light such as light ray 28 that is directed towards device 10 at a non-zero angle A with respect to device front face surface normal 50. Surface normal 50 is perpendicular to the plane of the front and rear surfaces of display cover layer 22 and is perpendicular to the plane of the front and rear faces of light diffuser 46 (i.e., light diffuser 46 may line in a plane parallel to the plane of display cover layer 22).

Light diffuser 46 diffuses incoming light and thereby reduces the directionality of sensor 30. Diffuser 46 helps enhance off-axis sensitivity, so that ambient light measurements accurately reflect the overall amount of ambient light surrounding electronic device 10, rather than measuring incoming light mainly from a particular direction.

Diffuser 46 may be mounted on the top of light sensor housing 44 (and may therefore be considered to form the upper surface of the light sensor housing). Diffuser 46 may be attached to light sensor housing 44 using adhesive, using fasteners such as screws, using clips or other engagement features, or other attachment mechanisms. If desired, diffuser 46 may be overmolded onto light sensor housing 44. For example, diffuser 46 and light sensor housing 44 may be formed from separate shots of plastic in a plastic injection molding process. Light sensor housing 44 may be formed from an opaque material such as black plastic to prevent stray light from entering the sidewalls or rear (lower) wall of housing 44. Diffuser 46 may be formed from clear plastic or other material that is transparent to light 28. Photodetector 32 may be light sensitive component for measuring the intensity of incoming light 28 and may be mounted at the bottom of light sensor housing 44 or elsewhere in the structures that form light sensor 30.

Electronic device housing 12 may contain internal housing structures such as mounting brackets, midplate structures, rails, frames, and other support structures. For example, housing 12 may contain a support structure such as support structures 42 to help support and mount components such as light sensor 30 within device 10. Support structures 42 may be formed from a metal member (e.g., a metal bracket structure) or other structures.

Support structures 42, which may sometimes be referred to as a bracket or support member, may have one or more openings such as opening 48. Opening 48 may be aligned with light window 24 in opaque masking layer 26 to ensure that light 28 can reach diffuser 46. Once incoming ambient light 28 strikes diffuser 46, the incoming light is diffused. Some of the diffused light reaches photodetector 32 and is converted into a light detector signal for processing by control circuitry within device 10 (e.g., control circuitry in one or more integrated circuits among electronic devices 38 on printed circuit 40 of FIG. 2). If desired, other mounting arrangements may be used for light sensor 30 (e.g., arrangements in which light sensor 30 is aligned with an opening in housing 12, etc.). The use of bracket 42 to help secure light sensor 30 and/or other structures within device housing 12 in alignment with light window 24 on display cover layer 22 is merely illustrative.

Figure 4:
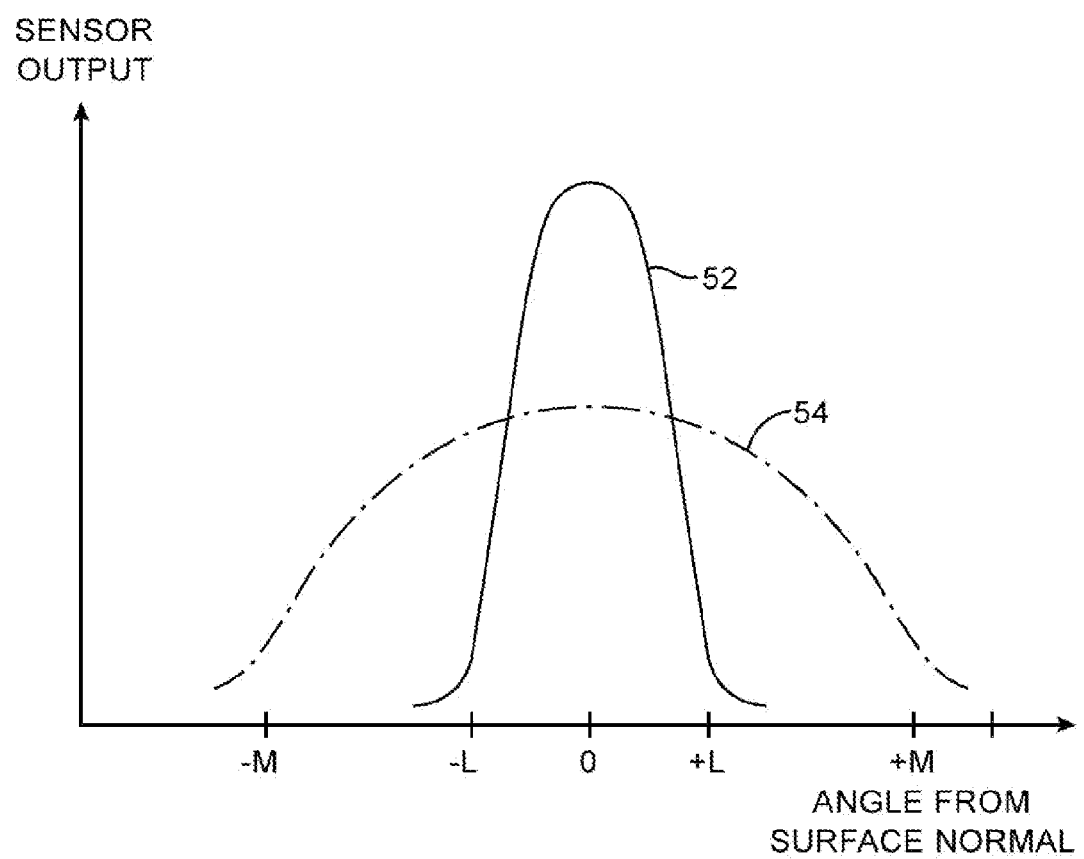
FIG. 4 is graph showing how the presence of a light diffuser such as a molded light diffuser in a light sensor such as an ambient light sensor reduces light sensor directionality in accordance with an embodiment.

FIG. 4 is a graph showing how the electrical sensor output signal from light sensor 30 varies as a function of incoming light angle A for light passing through light window 24.

Angle A represents the angular deviation for the incoming light from surface normal 50 of FIG. 3.

Line 52 of FIG. 4 corresponds to the expected response of a light sensor without a light diffuser. In this situation, on-axis light is efficiently collected and measured by the light detector, but off-axis light (i.e., light at an angle greater than angle L or less than angle –L) is not efficiently collected and therefore cannot contribute to an ambient light measurement. The narrow acceptance angle of the sensor associated with solid line 52 (i.e., the relatively high directionality of this type of sensor) may create inaccuracies when attempting to make ambient light measurements for the environment surrounding an electronic device.

Line 54 of FIG. 4 corresponds to the response of a light sensor that includes light diffuser 46. In this situation, on-axis light is collected slightly less efficiently than the on-axis light collected by the sensor associated with line 52 because some of the on-axis light is diffused away from photodetector 32. However, off-axis light collection efficiency is significantly improved due to the ability of light diffuser 46 to diffuse some of the off-axis light towards photodetector 32. The improved off-axis performance of a light sensor with light diffuser 46 is indicated by the significantly larger sensor output associated with incoming light angles between L and M and between –L and –M. The use of light diffuser 46 therefore helps reduce directionality and makes light sensor 30 less sensitive to orientation when making ambient light measurements.

Figure 5:
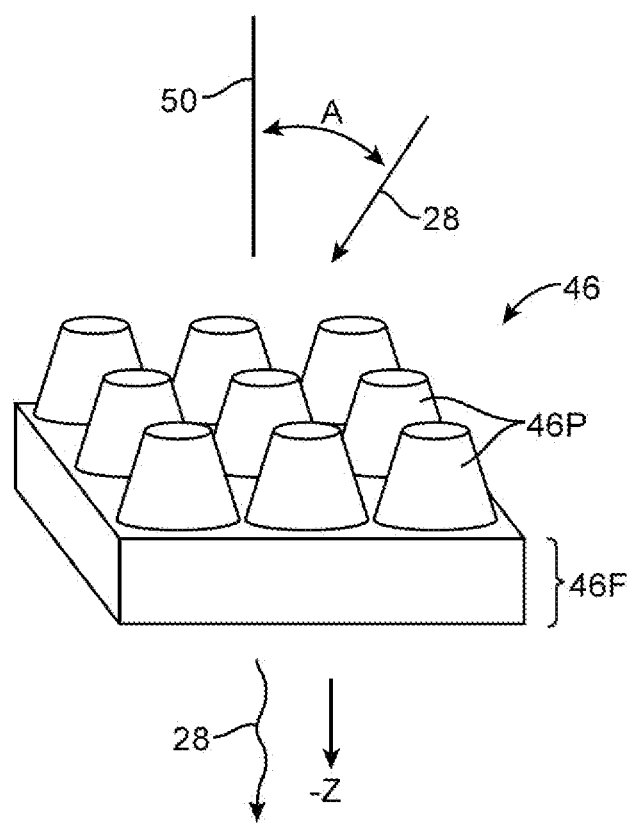
FIG. 5 is a perspective view of an illustrative molded diffuser having an array of protrusions such as flat-topped cones that may be used to diffuse light in a light sensor such as an ambient light sensor in accordance with an embodiment.

A perspective view of an illustrative configuration for light diffuser 46 of light sensor 30 is shown in FIG. 5. As shown in FIG. 5, diffuser 46 may have a planar substrate portion 46F from which protrusions 46P in an array of protrusions 46P protrude outwardly. When light diffuser 46 is installed in device 10, protrusions 46P may protrude downwardly towards photodetector 32 (as an example).

Protrusions 46P may have the shape of flat-topped cones as shown in FIG. 5 or may have other shapes suitable for directing incoming off-axis light rays such as ray 28 at angle. A downwards in vertical direction –Z towards photodetector 32 in light sensor housing 44. Cones are rotationally symmetric, which helps ensure that light diffuser 46 will exhibit low directionality. The flat tops in flat-topped cones 46P of FIG. 5 help ensure that on-axis light can be sensed and will not be unnecessarily scattered.

Protrusions 46P may be arranged in a two dimensional array having multiple rows and columns (e.g., tens or hundreds of rows and columns or more) or may be arranged in other patterns on the surface of substrate portion 46F. The material that is used in forming protrusions 46P and substrate portion 46F may be a clear polymer such as polyethyleneterephthalate (PET) or polycarbonate (PC) or other transparent material. Compression molding techniques, injection molding techniques, or other techniques may be used in forming diffuser 46. Substrate portion 46F and molded light scattering features such as protrusions 46P or other arrays of molded light scattering features may be formed as parts of a single integral plastic member or may, if desired, be formed using two or more separate plastic structures. Configurations in which diffuser 46 is formed from a molded plastic member are sometimes described herein as an example. In general, any suitable structures may be used in forming a structure that diffuses light for light sensor 30.

Figure 6:
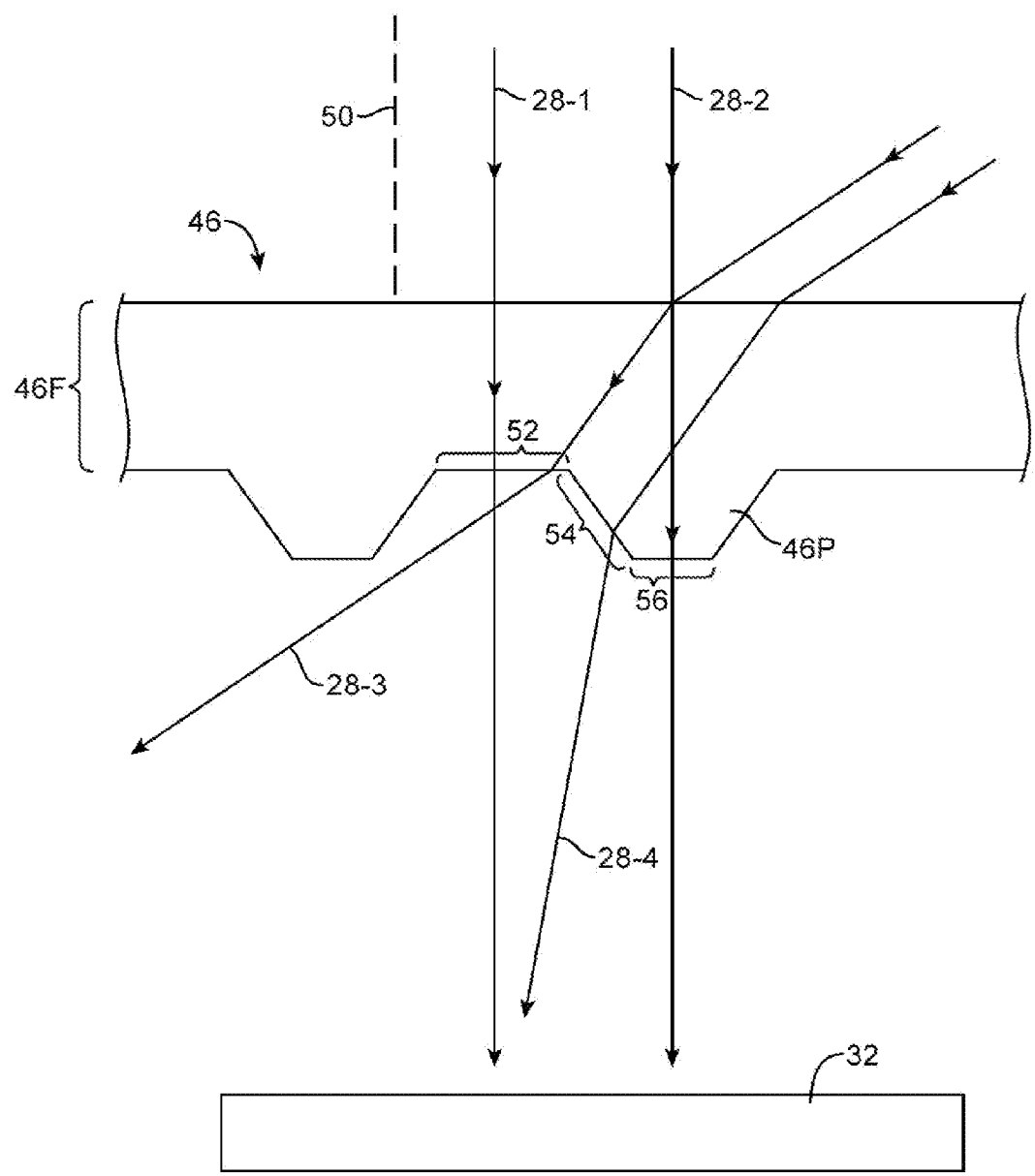
FIG. 6 is a cross-sectional side view of a diffuser of the type shown in FIG. 5 showing how angled light may be diffused so as to strike a photodetector in accordance with an embodiment.

FIG. 6 is a cross-sectional side view of diffuser 46 of FIG. 5 showing how incoming light rays may be directed towards photodetector 32 of light sensor 30. As shown in FIG. 6, the presence of protrusions 46P on substrate portion 46F of diffuser 46 give rise to angled protrusion surfaces 54 (e.g., the sides of the flat-topped cones in configurations in which protrusions 46P are flat-topped cones). Diffuser 46 also has flat protrusion surfaces 56 on protrusions 46P and has flat substrate areas 52 on substrate portion 46F that are formed from the spaces between respective protrusions 46P. The flat regions on substrate portion 46F such as flat areas 52 allow incoming light rays such as vertical light ray 28-1 and similar nearly vertical rays to pass through diffuser 46 and reach photodetector 32. Likewise, the flat regions on protrusions 46P such as flat areas 56 allow incoming light rays such as vertical light ray 28-2 and similar nearly vertical light rays to reach photodetector 32. Angled protrusion surfaces such as the angled surfaces in areas 54 are angled at non-zero angles with respect to surface normal 50 and therefore tend to direct light rays such as angled light ray 28-4 downwards towards photodetector 32. Some angled light rays such as angled light ray 28-3 strike flat areas such as areas 52 and 56 and tend to pass through detector 30 without being deflected towards photodetector 32. Nevertheless, the presence of protrusions 46F and angled protrusion surfaces 54 can help increase the amount of off-axis light reaching photodetector 32, as illustrated by off-axis light ray 28-4.

Figure 7:
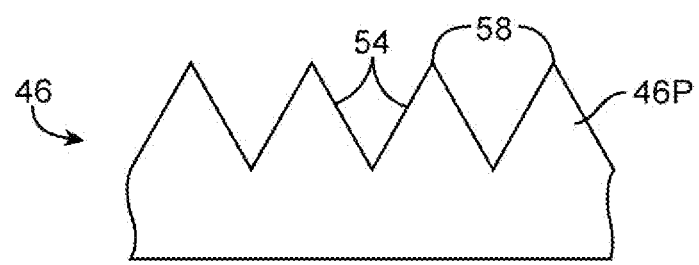
FIG. 7 is a cross-sectional side view of an illustrative diffuser with pointed protrusions that may be used to diffuse light in a light sensor such as an ambient light sensor in accordance with an embodiment.
Figure 8:
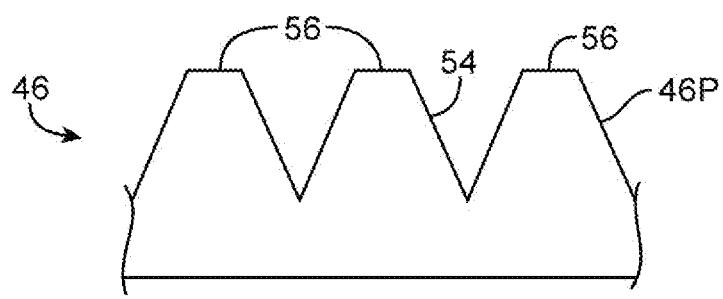
FIG. 8 is a cross-sectional side view of an illustrative diffuser with flat-topped diffuser protrusions that may be used to diffuse light in a light sensor such as an ambient light sensor in accordance with an embodiment.
Figure 9:
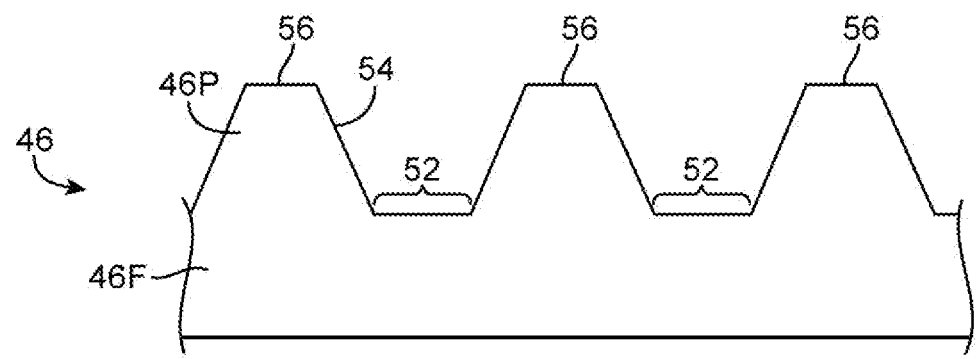
FIG. 9 is a cross-sectional side view of an illustrative diffuser with flat-topped diffuser protrusions that are separated from each other by flat areas on the surface of the diffuser in accordance with an embodiment.

In the illustrative example of FIG. 5, diffuser 46 was provided with protrusions 46P that have the shape of flat-topped cones. If desired, diffuser 46 may have other shapes. FIG. 7 is a cross-sectional side view of diffuser 46 showing how protrusions 46 may have sharp tips 58. In the illustrative configuration of FIG. 8, protrusions 46P have been provided with flat tops and are spaced relatively close to each other. As shown in FIG. 9, protrusions 46P with flat tops may be spaced apart from each other to create flat areas 52 between the protrusions on substrate portion 46F. As described in connection with FIG. 6, the inclusion of flat diffuser areas such as areas 56 and 52 helps ensure that on-axis light rays reach photodetector 32.

Figure 10:
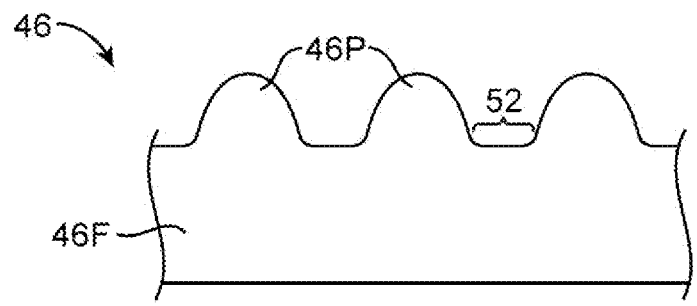
FIG. 10 is a cross-sectional side view of an illustrative diffuser of the type that may be formed from a molded clear plastic structure with rounded protrusions in accordance with an embodiment.
Figure 11:
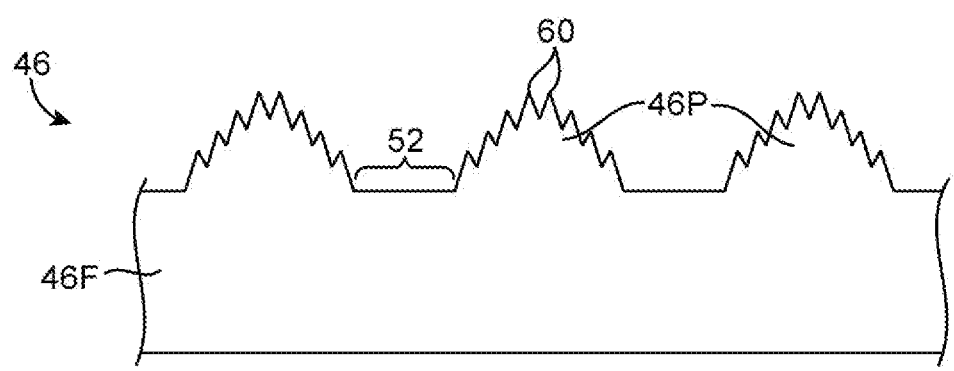
FIG. 11 is a cross-sectional side view of an illustrative diffuser of the type that may be formed from a molded clear plastic structure with protrusions that have rough surfaces in accordance with an embodiment.

If desired, protrusions 46P may have rounded profiles, as shown in FIG. 10. FIG. 11 shows how protrusions 46P may be provided with surface roughness features 60 (i.e., undulations, pits, bumps, and other surface features with dimensions that can be significantly smaller than the dimensions of protrusions 46P or other primary light scattering features in light diffuser 46).

Figure 12:
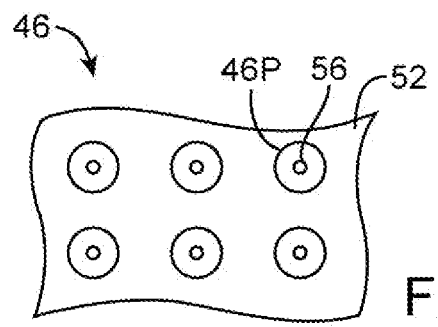
FIG. 12 is a top view of an illustrative diffuser of the type that may be formed from a molded clear plastic structure with flat-topped circular cone shaped diffuser protrusions in accordance with an embodiment.
Figure 13:
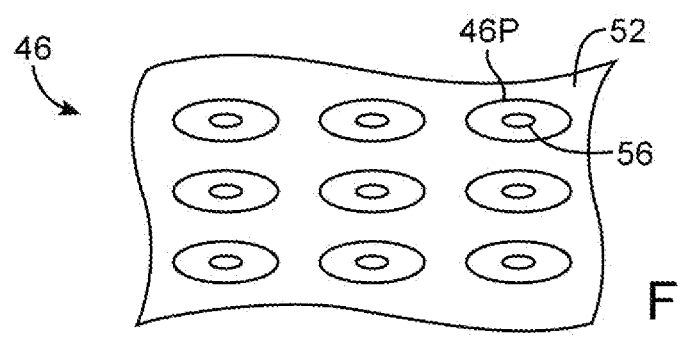
FIG. 13 is a top view of an illustrative diffuser of the type that may be formed from a molded clear plastic structure with flat-topped elliptical cone shaped diffuser protrusions in accordance with an embodiment.
Figure 14:
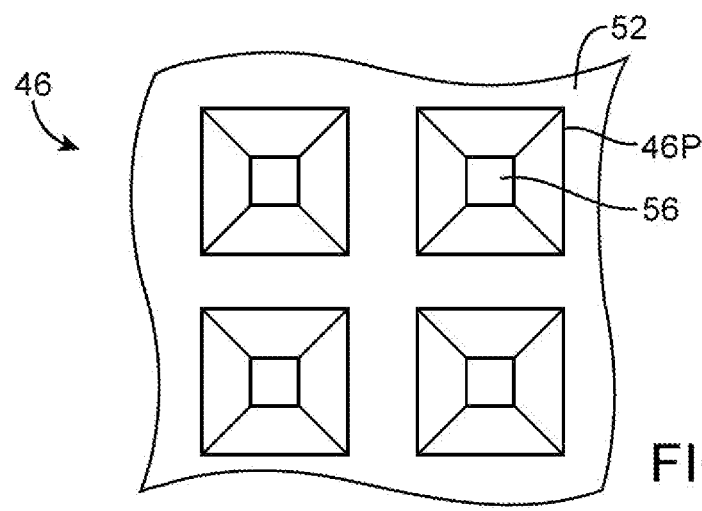
FIG. 14 is a top view of an illustrative diffuser of the type that may be formed from a molded clear plastic structure with flat-topped square pyramidal shaped diffuser protrusions in accordance with an embodiment.
Figure 15:
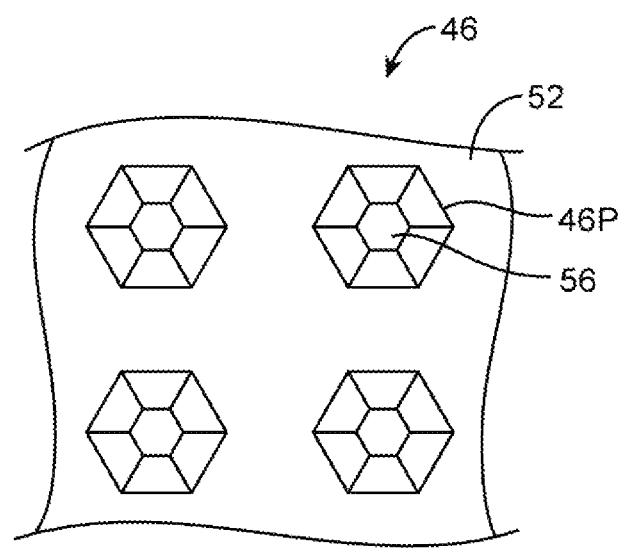
FIG. 15 is a top view of an illustrative diffuser of the type that may be formed from a molded clear plastic structure with flat-topped hexagonal pyramidal shaped diffuser protrusions in accordance with an embodiment.

Other types of protrusions 46P may be used in diffuser 46 if desired. Moreover, protrusions 46P may be formed on the upper surface of diffuser 46, on the lower surface of diffuser 46, or on both the upper and lower surfaces of diffuser 46. Protrusions 46 may have circular footprints (i.e., circular outlines when viewed from above along vertical dimension –Z (FIG. 5) or may have footprints of other suitable shapes. In the illustrative top view of FIG. 12, diffuser 46 has been formed from an array of flat-topped cones having circular footprints. FIG. 13 is a top view of an illustrative diffuser in which protrusions 46P have elliptical footprints. In the FIG. 14 example, protrusions 46P have been formed from flat-topped pyramidal structures having square footprints. Pyramidal-type structures may also be formed using footprints with other shapes (see, e.g., the flat-topped hexagonal pyramidal protrusions 46P of FIG. 15).

Figure 16:
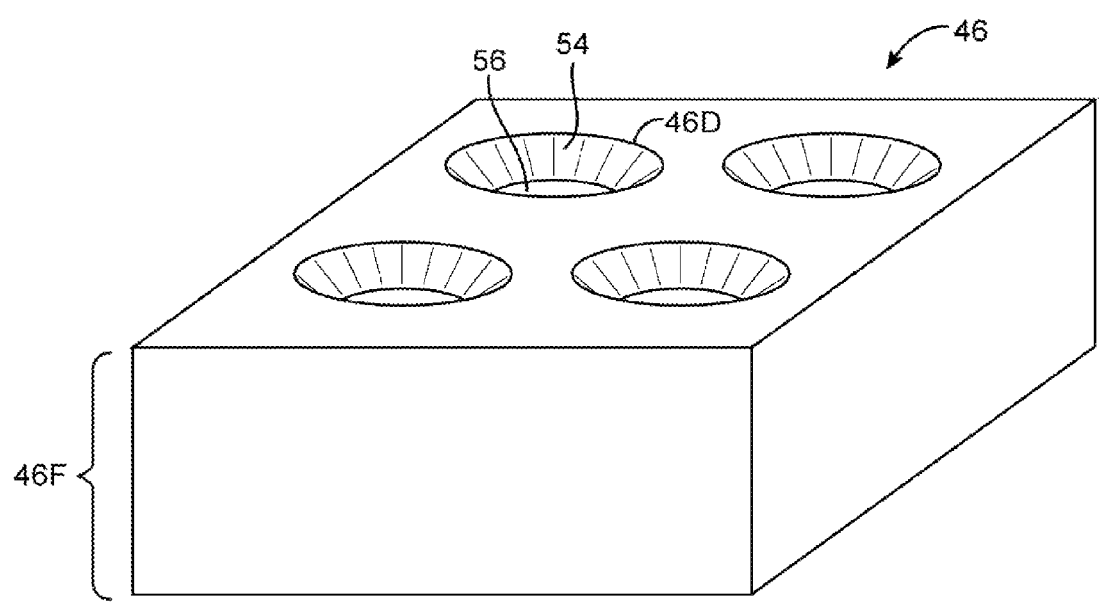
FIG. 16 is a perspective view of an illustrative diffuser of the type that may be formed from a molded clear plastic structure with an array of depressions in accordance with an embodiment.

If desired, depressions (e.g., pits, channels, or other recesses) may be formed in substrate 46F to serve as light scattering features for diffuser 46. As shown in FIG. 16, for example, diffuser 46 may have an array of molded light scattering features such as an array of circular depressions 46D with flat bottoms 56 and angled sidewall surfaces 54. Depressions 46D may have other shapes (e.g., flat-bottomed cones with elliptical footprints, flat-bottomed pyramidal depressions with footprints that are square, rectangular, hexagonal, or other shapes, depressions with roughened surfaces, depressions with curved sidewalls, etc.).

Figure 17:
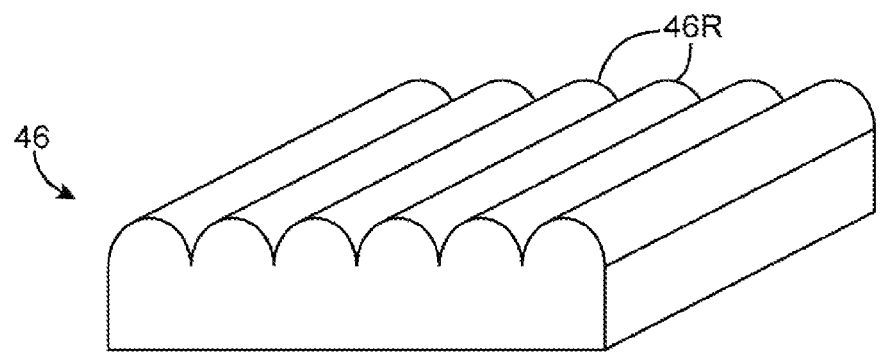
FIG. 17 is a perspective view of an illustrative diffuser structure for a light diffuser of the type that may be formed from a molded clear plastic structure with raised ribs in accordance with an embodiment.
Figure 18:
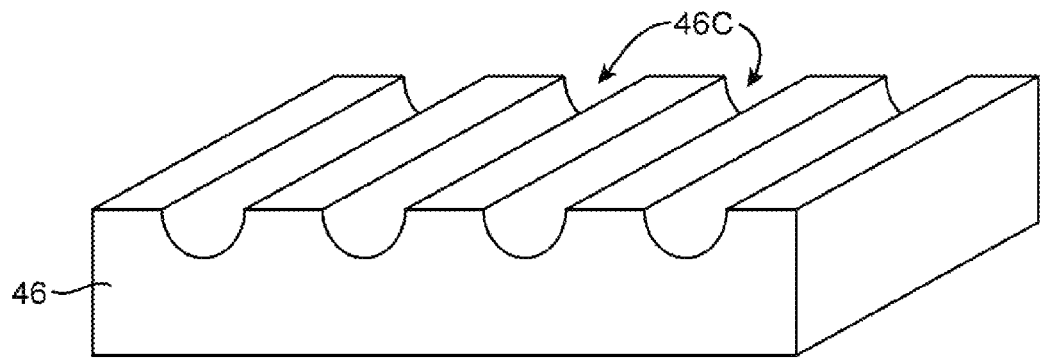
FIG. 18 is a perspective view of an illustrative diffuser structure for a light diffuser of the type that may be formed from a molded clear plastic structure with channels in accordance with an embodiment.
Figure 19:
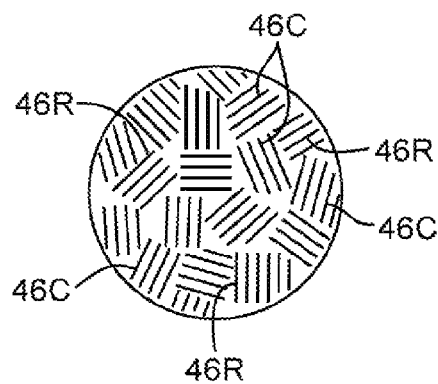
FIG. 19 is a top view of an illustrative light diffuser for a light sensor such as an ambient light sensor having light diffuser structures such as rib and channel structures of the types shown in FIGS. 17 and 18 arranged in a random pattern of orientations to diffuse light in accordance with an embodiment.

Some or all of the surface(s) of diffuser 46 may be provided with laterally elongated protrusions such as ribs 46R of FIG. 17 or laterally elongated depressions such as channels 46C of FIG. 18. To ensure that diffuser 46 exhibits minimal directionality, the surface of diffuser 46 may be provided with a randomly oriented patchwork of channels and/or grooves as shown in the top view of illustrative diffuser 46 of FIG. 19. In the example of FIG. 19, a combination of ribs and grooves form diffuser 46. If desired, diffuser 46 can contain only ribs or only grooves (e.g., ribs or grooves arranged in random orientations as shown in FIG. 19).

Figure 20A:
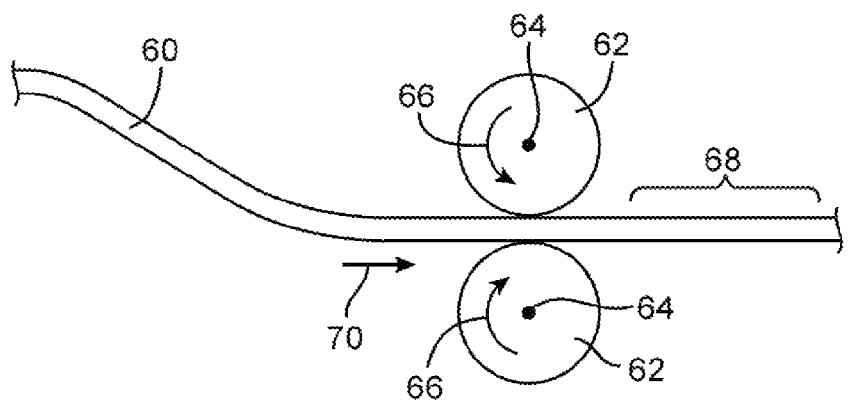
FIG. 20A is a cross-sectional side view of a compression molding system with rollers for embossing a polymer film to create a diffuser in accordance with an embodiment.

FIG. 20A shows how diffuser material can be formed using molding techniques. In the example of FIG. 20A, compression molding equipment is formed from a pair of rollers 62. Polymer film 60 is fed through rollers 62 in direction 70. Rollers 62 rotate about rotational axes 64 in directions 66. Polymer film 60 is initially featureless. Rollers 62 preferably contain pits, bumps, grooves, channels, or other protrusions and/or depressions for creating corresponding surface features on one or both of the opposing surfaces of polymer film 60. During compression molding operations, film 60 is received between rollers 62 and corresponding compression molded polymer film 68 exits rollers 62 in direction 70.

Figure 20B:
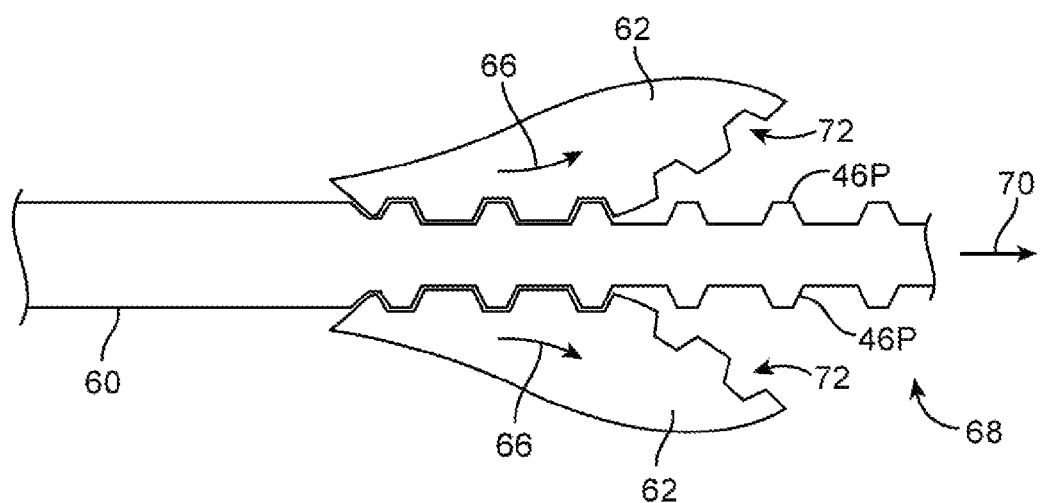
FIG. 20B is a cross-sectional side view of a portion of the rollers and polymer film of FIG. 20A showing how the polymer film may be provided with protrusions using depressions in the rollers in accordance with an embodiment.

FIG. 20B is a detailed view of the surfaces of rollers 62 in an illustrative configuration in which rollers 62 contain depressions 72. With this type of arrangement, compression molded polymer film 68 contains corresponding diffuser protrusions 46P (e.g., flat-topped conical protrusions or protrusions of other shapes). If desired, protrusions 46P may be formed on only one side of film 68. The configuration of FIG. 20B in which protrusions 46P have been formed on opposing upper and lower surfaces of film 68 is shown as an example. After forming compression-molded film 68, film 68 may be divided into individual diffuser pieces. Diffusers such as diffuser 46 may, for example, be formed from die cut portions of molded film 68. If desired, compression molding operations may be used to form surface features in molded polymer material 68 with other shapes. The example of FIG. 20B is merely illustrative.

Figure 20C:
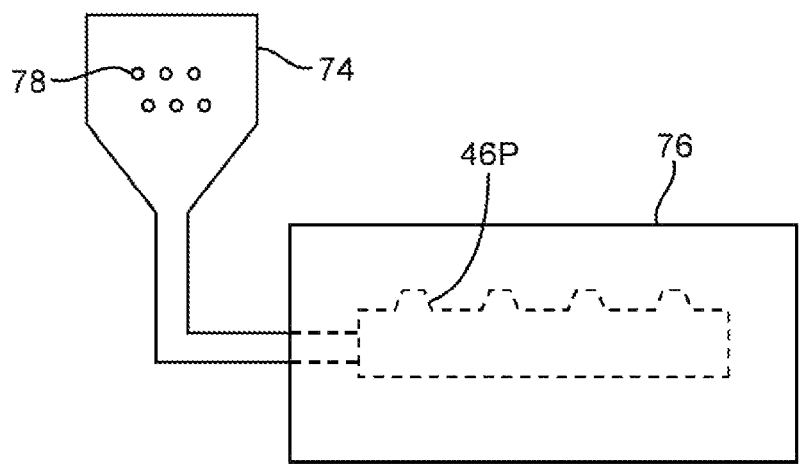
FIG. 20C is a system diagram of illustrative equipment for forming a light diffuser for an ambient light sensor such as an injection molding tool of the type that may be used to create a molded diffuser structure in accordance with an embodiment.

FIG. 20C shows how injection molding techniques may be used to form diffuser 46. Initially, polymer beads 78 may be stored in hopper 74. When it is desired to form diffuser 46, the polymer beads may be heated to form molten polymer material that is injected into the interior (mold cavity) of injection molding die 76. Die 76 may have flat-bottomed depressions for forming a diffuser with flat-topped protrusions 46P or may have other suitable shapes for forming a desired injection-molded diffuser.

Figure 21:
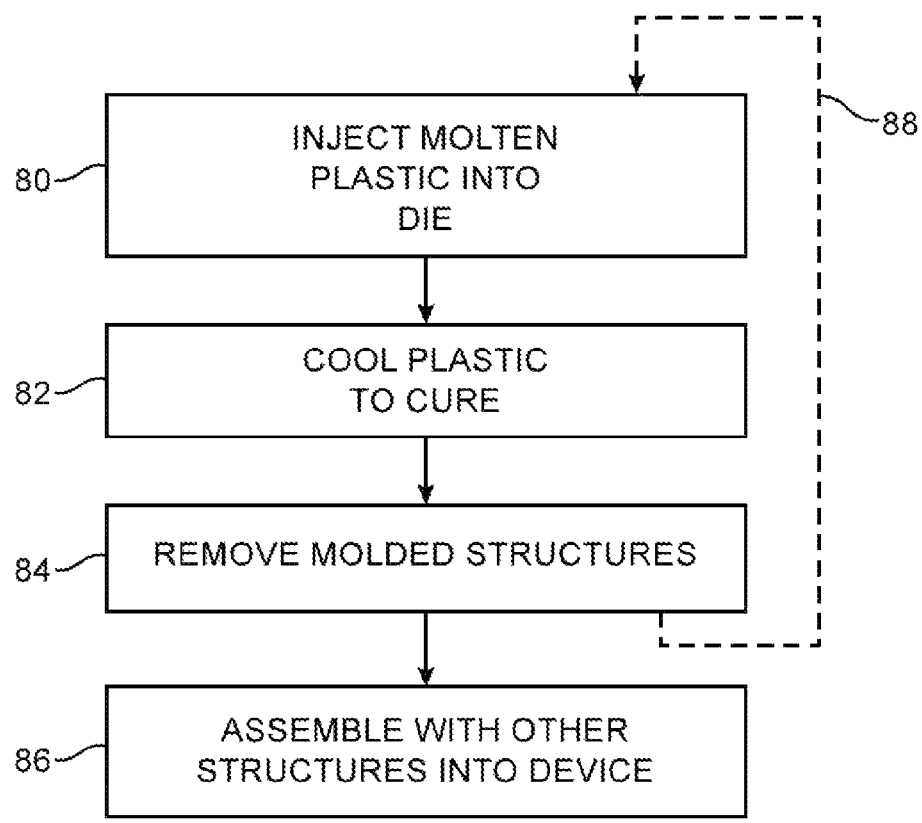
FIG. 21 is a flow chart of illustrative steps involved in forming structures for an ambient lights sensor such as diffuser structures and light sensor housing structures in accordance with an embodiment.

Illustrative steps involved in forming diffusers using a molding process such as an injection molding process are shown in FIG. 21.

At step 80, molten plastic may be injection molded into a mold die such as die 76 of FIG. 20C. The cavity in the mold die has the shape of a desired diffuser 46. After cooling the molten plastic at step 82 and removing the cooled part from the mold die at step 84, one or more additional optional shots of molten plastic may be injection molded (e.g., to form additional portions of light sensor 30), as shown by line 88. As an example, all or part of sensor housing walls 44 may be injection molded (overmolded) onto molded diffuser 46 or molded diffuser 46 may be formed by injection molding clear plastic material onto sensor housing walls 44. If desired, a photodetector device, sensor leads, and other structures may be incorporated into molded parts during molding (i.e., sensor components can be partly covered with molten plastic during insert molding operations). Injection molded light sensor structures may be assembled with other structures to form electronic device 10 during the operations of step 86. If desired, a combination of injection molded parts and compression molded parts may be used in forming light sensor 30. For example, sensor housing 44 may have injection molded walls and diffuser 46 may be formed using compression molding techniques, etc. In this type of situation, the plastic of sensor housing 44 may be molded to diffuser 46. Molding operations that include three or more molded light sensor structures and/or material that is machined or otherwise patterned to form diffuser and housing structures may also be used. Adhesive, interlocking engagement features such as clips, fasteners, plastic welds, and other attachment techniques may be used in addition to or instead of using multiple shots of plastic to attach portions of light sensor 30 together. Injection molding techniques that involve heating plastic sufficiently to melt the plastic are preferably formed from thermoplastic materials (i.e., materials that can be placed in a molten state by application of heat). If desired, plastic structures for diffuser 46 and/or light sensor housing 44 may be formed using a mold die to define a desired shape for a thermoset material (e.g., a liquid polymer that is cured to form solid diffuser and/or housing structures using heat or ultraviolet light curing). The molding operations of FIG. 21 are merely illustrative.

Figure 22:
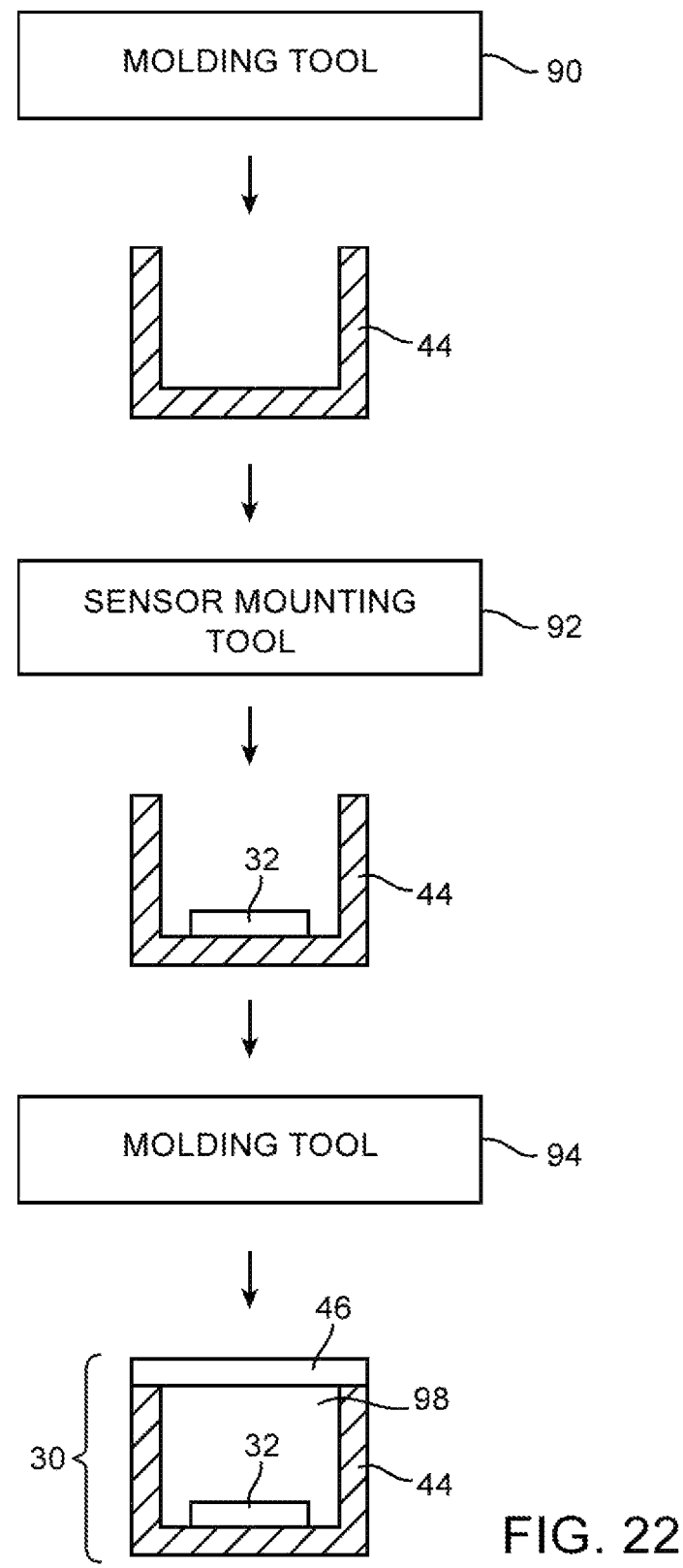
FIG. 22 is a diagram showing equipment and operations that may be used in forming an ambient light sensor with an integral molded diffuser in accordance with an embodiment.

FIG. 22 is a system diagram showing how light sensor 30 may be formed using molding techniques. In the example of FIG. 22, molding tool 90 (e.g., an injection molding tool) may be used to form light sensor housing 44. Light sensor housing 44 may, for example, be formed from an opaque plastic such as injection molded black plastic. Light sensor housing 44 may have the shape of an opened-top box or other suitable shape. The U-shaped walls of housing 44 in FIG. 22 correspond to an illustrative light sensor housing cross section for an open-topped cube-shaped box. In the example of FIG. 22, housing walls 44 are formed before mounting photodetector 32 within housing walls 44 using sensor mounting tool 92 (e.g., a computer-controlled positioner or other mounting tool). If desired, molding tool 90 may be used to injection mold plastic for housing structures 44 around the sides of photodetector 32 (i.e., around a semiconductor die or a semiconductor package with protruding leads on which a semiconductor die can be mounted). For example, molding techniques may be used to allow the leads for the package to protrude through the rear of housing wall 44. Openings may also be formed in housing wall 44 when molding housing wall with tool 90 to accommodate photodetector terminals. After forming light sensor housing structure 44 and mounting photodetector 32 within housing wall 44, molding tool 94 may be used to mold clear plastic for diffuser 46 onto sensor 30. For example, molding tool 94 may overmold clear plastic for diffuser 46 onto housing walls 44 to create an internal cavity 98 that includes photodetector 32, as show in FIG. 22. A molded light diffuser may also be attached to housing walls 44 using adhesive, clips or other engagement features, fasteners, welds, etc.

Figure 23:
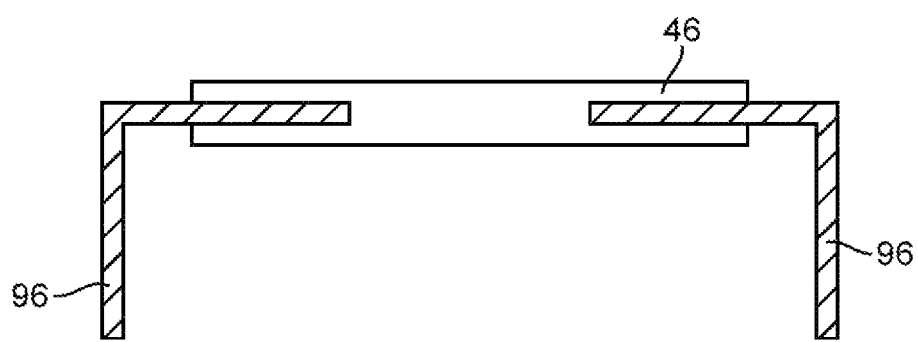
FIG. 23 is a cross-sectional side view of an illustrative light diffuser that has been formed from clear plastic overmolded onto a metal frame or other structure in accordance with an embodiment.

If desired, plastic overmolding operations for light sensor structures such as light sensor housing 44 and diffuser 46 may involve molding plastic material over one or more preformed structures such as metal structures, carbon fiber composite structures or other fiber composites, glass structures, ceramic structures, or other structures. As shown in FIG. 23, for example, diffuser 46 may be formed from clear plastic that is overmolded over structures 96. Structures 96 may be support structures such as one or more metal brackets or other metal members (see, e.g., support structures 42 of FIG. 3), may be internal frame members, metal midplate structures or other structural housing members (e.g., parts of housing 12 of device 10), other internal structures in device 10, or other structures. If desired, light sensor housing structures 44 may be overmolded over structures 96. To facilitate mounting of structures 96 in device 10, structures 96 may include screw holes, engagement features such as prongs and openings for clips, springs, and other engagement structures. Structures 96 may be formed by machining, stamping (e.g., using a die press), laser processing techniques, or other techniques.

Figure 24:
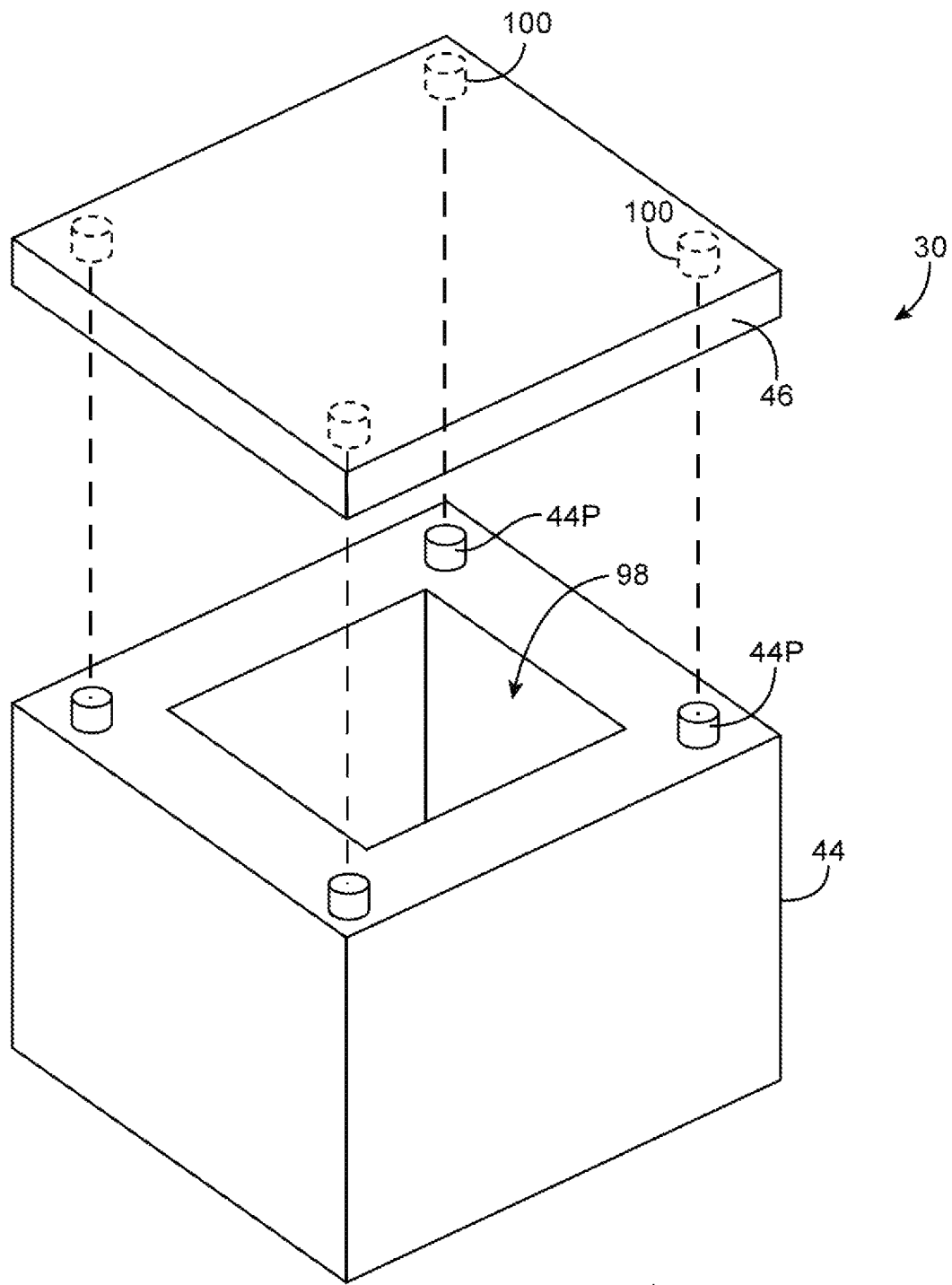
FIG. 24 is a perspective view of an illustrative light sensor such as an ambient light sensor that has an opaque light sensor housing with alignment features such as posts that mate with corresponding alignment features such as alignment holes in a molded diffuser in accordance with an embodiment.

FIG. 24 is a perspective view of an illustrative configuration for light sensor structures such as light sensor housing 44 and diffuser 46. In the illustrative arrangement of FIG. 24, light sensor housing 44 has an open-topped box shape that defines an internal cavity such as cavity 98. Photodetector 32 may be located at the bottom of cavity 98.

Diffuser 46 may be attached to the top of light sensor housing 44 to form light sensor 30. Adhesive, plastic welds, interlocking engagement features, screws or other fasteners, injection molding, or other attachment mechanisms may be used to attach diffuser 46 to light sensor housing 44. In the example of FIG. 24, light sensor 44 and diffuser 46 have mating alignment features. Light sensor housing 44 has protrusions such as alignment posts 44P and diffuser 46 has corresponding alignment holes 100. There are four alignment posts 44P and four associated alignment holes 100 in the example of FIG. 24. This is merely illustrative. Light sensor housing 44 may have one or more alignment posts, two or more alignment posts, three or more alignment posts, or other suitable number of alignment posts. Diffuser 46 may have one or more alignment holes, two or more alignment holes, three or more alignment holes, or other suitable number of alignment holes. Configurations for light sensor housing 44 and diffuser 46 in which diffuser 46 is provided with one or more alignment protrusions such as one or more alignment posts and in which light sensor housing 44 is provided with one or more mating alignment holes may also be used. If desired, light sensor housing 44 may have both alignment protrusions (e.g., cylindrical alignment posts or other alignment posts) and alignment recesses (e.g., cylindrical alignment holes or other alignment holes) and diffuser 46 may have a corresponding set of alignment recesses and alignment protrusions. For example, if light sensor housing 44 contains M alignment posts and N alignment holes, diffuser 46 may contain M mating alignment holes and N mating alignment posts. Alignment features based on ribs, channels, and other features may also be used. Interlocking alignment features (sometimes referred to as engagement features) may be used both to align housing 44 and diffuser 46 with respect to each other and to attach housing 44 and 46 together.

Figure 25:
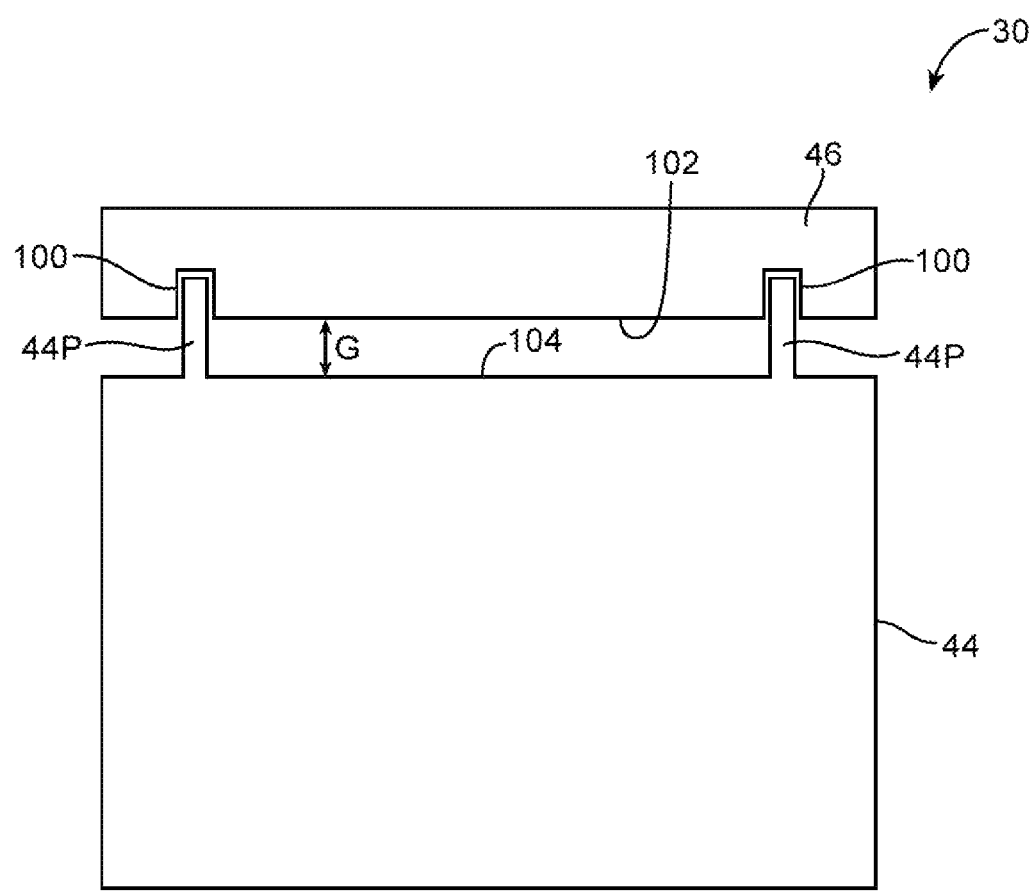
FIG. 25 is a cross-sectional side view of an illustrative light sensor housing with standoff posts that create a gap between an associated molded diffuser and the upper surface of the light sensor housing in accordance with an embodiment.

FIG. 25 is a cross-sectional side view of an illustrative configuration for light sensor 30 in which alignment protrusions 44P have been configured to serve as standoffs that create a separation such as gap G between lower surface 102 of diffuser 46 and upper surface 104 of light sensor housing 44. Alignment protrusions 44P of FIG. 25 may be alignment posts with a cylindrical cross-sectional shape, a square cross-sectional shape, or other suitable cross-sectional shape. Alignment posts 44P of FIG. 25 may be received within mating alignment recesses such as alignment holes 100 in diffuser 46.

Figure 26:
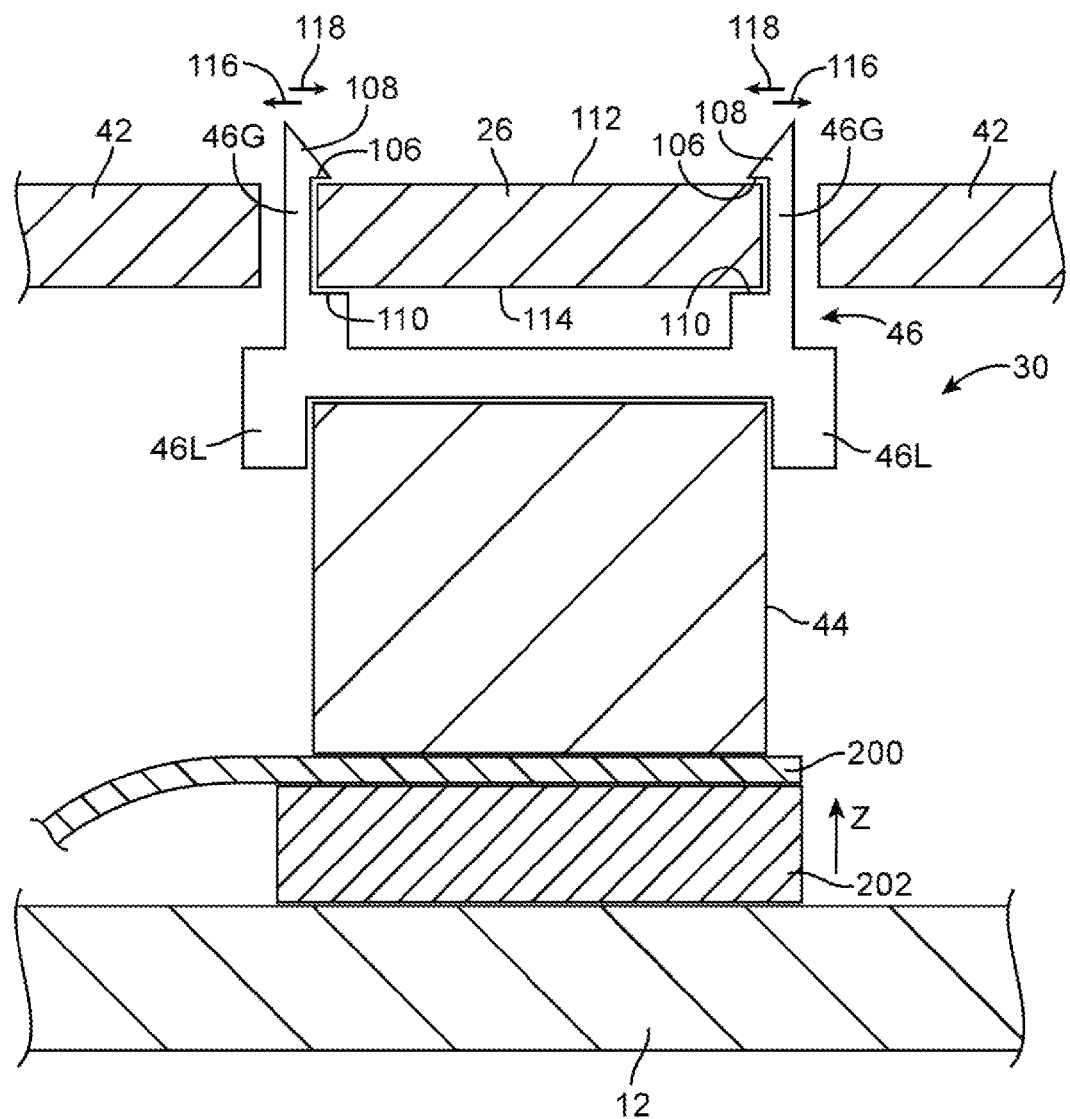
FIG. 26 is a cross-sectional side view of an illustrative light sensor in which a molded diffuser has alignment features for aligning the diffuser with respect to a light sensor housing and has engagement features for attaching the diffuser to a mounting bracket in accordance with an embodiment.

Features may be formed in diffuser 46 and/or housing 44 of light sensor 30 to facilitate alignment and attachment to other device structures. Consider, as an example, the arrangement of FIG. 26. In the example of FIG. 26, diffuser 46 has been provided with engagement features (mounting and alignment features) such as integral alignment ridges 46L and integral alignment and mounting clips 46G.

Light sensor housing 44 may have a box shape. Ridges 46L may be formed on the lower surface of diffuser 46 in a configuration that receives the upper portion of light sensor housing 44 (as an example). Other alignment features may be formed as part of diffuser 46 and/or light sensor housing 44 if desired (e.g., alignment recesses and/or alignment protrusions of the type described in connection with FIG. 25).

Clips 46G may extend upward from diffuser 46 in alignment with mating openings in structures 42. Structures 42 may be a metal structure such as a metal mounting bracket or other metal member or may be formed from other materials (e.g., plastic support structure material, glass, ceramic, fiber composite material, etc.). Clips 46G may include wedge-shaped tips 108. Tips 108 may have lower surfaces 106. The main body of diffuser 46 may have opposing upper surfaces 110. When clips 46G are inserted upwards through the holes in bracket 42, the angled surfaces of wedges 108 bear against the sides of the holes in structures 42, thereby bending clips 46G outwards in directions 116. Diffuser 46 may be formed from a plastic material that is resilient (i.e., a material that springs back into its original shape after being bent). Once the wedge-shaped tips 108 of clips 46G have passed through the holes in bracket 42 sufficiently that the angled surfaces of clips 46G no longer bear against structures 42, clips 46G will spring back in directions 118, thereby locking bracket 42 in place between opposing downwards-facing diffuser alignment surfaces such as clip surfaces 106 and upwards-facing diffuser alignment surfaces 110. The use of these alignment surfaces and resilient (elastic) clip structures 46G mounts diffuser 46 to bracket 46 with a desired alignment. If desired, clip structures of this type may be used in attaching diffuser 46 to housing 44. Diffuser 46 may be attached to light sensor housing 44 using adhesive, fasteners such as screws, additional clips such as clips 46G, or other attachment mechanisms or may be joined with light sensor housing 44 by molding diffuser 46 to light sensor housing 44 or by molding light sensor housing 44 to diffuser 46. These techniques may also be used in attaching diffuser 46 to structures 42.

Light sensor housing 44 may be electrically connected to a substrate such as substrate 200. Electrical connections between light sensor 30 and substrate 200 may be formed from welds, conductive adhesive, solder, fasteners, connectors, or other conductive connections. Substrate 200 may be dielectric substrate formed from glass, ceramic, molded plastic, or other dielectric material. For example, substrate 200 may be a rigid printed circuit board formed from a rigid printed circuit board material such as fiberglass-filled epoxy or may be a flexible printed circuit such as a flex circuit formed from a sheet of polyimide or a layer of other flexible polymer. In the illustrative example shown in FIG. 26, light sensor 30 has been soldered to flexible printed circuit 200 (e.g., a flex circuit such as flex circuit 34 of FIG. 2) so that light sensor 30 may move in upwards direction Z to bear against structures 42. Biasing structure 202 may be interposed between the lower surface of flexible printed circuit 200 and an opposing inner surface of housing 12 or other housing structure. Biasing structure 202 may include compressed springs, compressed foam, other structures that press flexible printed circuit 200 and light sensor 30 upwards in direction Z. The biasing force provided by optional biasing structure 202 may help ensure that light sensor 30 is accurately seated in position relative to structures 42 and is properly aligned with respect to light window opening 24 in opaque masking layer 26 and the corresponding opening in structures 42 (i.e., opening 48)

Downwardly extending alignment protrusions 46L of FIG. 26 may have the shape of posts (e.g., four posts at four respective corners of light sensor housing 44), may have the shape of alignment rails that run across opposing edges of light sensor housing 44, or may have other shape for receiving light sensor housing 44 (e.g., interlocking alignment posts and holes or other engagement features, etc.).

Figure 27:
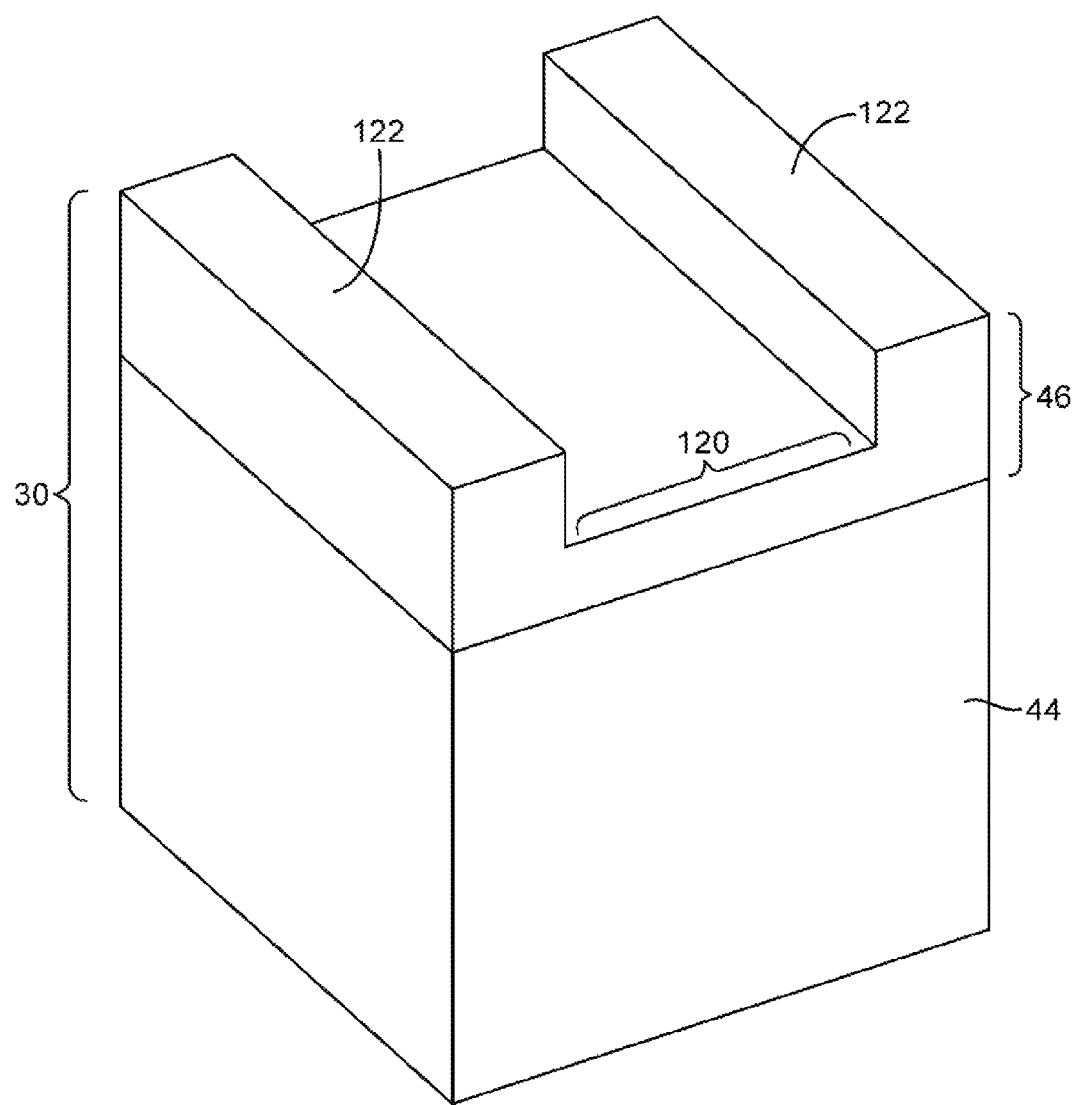
FIG. 27 is a perspective view of an illustrative light sensor such as an ambient light sensor having an opaque housing and an overmolded clear diffuser with integrated alignment ribs of the type that may be used to align the light sensor with respect to a mounting bracket in accordance with an embodiment.

FIG. 27 is a perspective view of light sensor 30 showing how diffuser 46 may be provided with a pair of alignment ribs 122 that run along opposing sides of diffuser 46. The spacing between ribs 122 creates recess 120. Recess 120 and alignment ribs 122 may be sized to engage with a mating portion in structures 42. For example, structures 42 may have the shape of a metal bracket with a rectangular section that is received within recess 120. In general, light sensor 30 (i.e., diffuser 46 and/or light sensor housing 44) may have alignment protrusions, alignment recesses, clips and other mounting structures for clipping or otherwise attaching light sensor 30 to housing 12, to other housing structures, to structures 42, etc.

To ensure that diffuser 46 is securely attached to light sensor housing 44 in configurations in which diffuser 46 and light sensor housing 44 are attached by plastic molding techniques, housing and/or diffuser 46 may be provided with engagement features that help engage overmolded plastic structures. As an example, light sensor housing 44 may be provided with engagement structures such as hooks 124 of FIG. 28 (e.g., hooks 124 may be formed as part of the process of injection molding housing 44). During subsequent injection molding operations, diffuser 46 may be overmolded over light sensor housing 44 so that some diffuser material is formed within regions 126 under hooks 124. This locks diffuser 46 to light sensor housing 44, so that diffuser 46 and light sensor housing 44 cannot be easily dislodged. If desired, diffuser 46 may be provided with hooks or other molding engagement structures and light sensor housing 44 may be overmolded on top of the molding engagement structures on diffuser 46.

Figure 28:
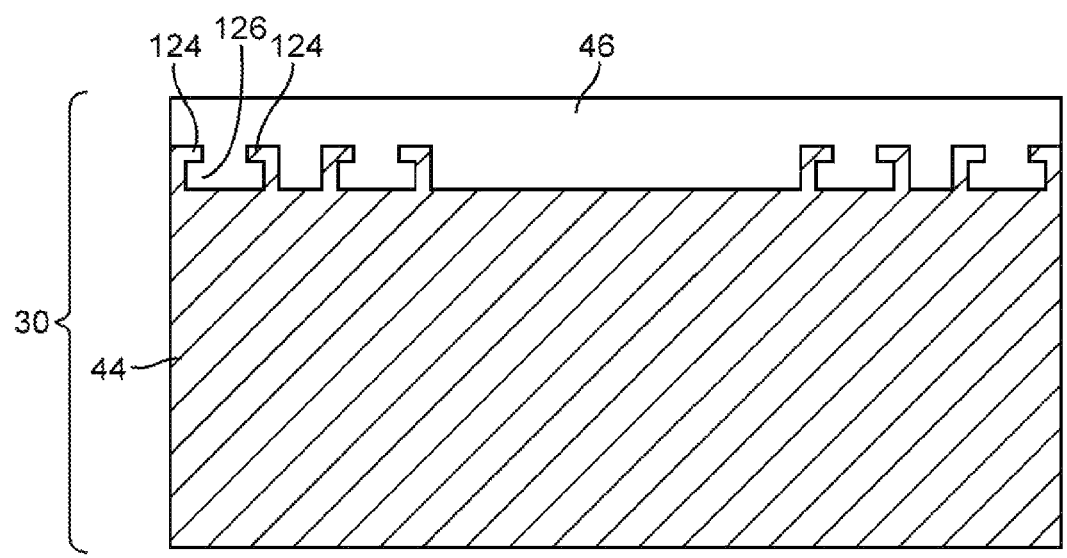
FIG. 28 is a cross-sectional side view of an illustrative light sensor housing having features that interlock with overmolded light diffuser plastic to secure a molded light diffuser to the light sensor housing during plastic molding operations in accordance with an embodiment.

The example of FIG. 28 in which diffuser 46 has been overmolded on top of light sensor housing 44 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
a light sensor housing;
a photodetector in the light sensor housing;
a plastic light diffuser that diffuses light entering the light sensor housing and that has first and second opposing surfaces, wherein the plastic light diffuser comprises an array of light scattering features formed on the first surface and mounting clips that extend from the second surface, and wherein the array of light scattering features and the mounting clips are integrally formed as a single plastic member; and
a support structure, wherein the plastic diffuser is interposed between the light sensor housing and the support structure, and wherein the support structure comprises openings through which the mounting clips extend to attach the plastic light diffuser to the support structure.

2. The apparatus defined in claim 1 wherein the array of light scattering features comprises flat-topped protrusions.

3. The apparatus defined in claim 2 wherein the flat-topped protrusions include flat-topped cones.

4. The apparatus defined in claim 1 wherein the array of light scattering features includes depressions in the plastic light diffuser.

5. The apparatus defined in claim 1 wherein the plastic light diffuser comprises a compression-molded clear polymer film.

6. The apparatus defined in claim 1 wherein the plastic light diffuser comprises injection-molded clear plastic.

7. The apparatus defined in claim 1 wherein the light sensor housing comprises a first shot of injection molded plastic and wherein the plastic light diffuser comprises a second shot of injection molded plastic that is overmolded over the first shot of injection molded plastic.

8. The apparatus defined in claim 1 wherein the plastic light diffuser has alignment features selected from the group consisting of: alignment protrusions and alignment recesses.

9. The apparatus defined in claim 1 wherein the light sensor housing has a first set of alignment features and wherein the plastic light diffuser has a mating second set of alignment features to align the light diffuser to the light sensor housing.

10. The apparatus defined in claim 1 wherein the support structure comprises a metal bracket and wherein the mounting clips are received in the openings to attach the plastic light diffuser to the metal bracket.

11. An electronic device, comprising:
a display having a display cover layer coated with an opaque masking layer that has a light window;
an ambient light sensor aligned with the light window; and
a molded light diffuser for the ambient light sensor that diffuses light passing to the ambient light sensor through the light window, wherein the molded light diffuser has a planar surface through which the light enters the molded light diffuser and a second surface opposite the planar surface that has an array of molded protrusions comprising flat-topped cones with circular bases through which the light exits the molded light diffuser, wherein each flat-topped cone with a circular base has an angled surface and a flat surface, wherein a first portion of the light that enters the molded light diffuser along an axis exits the molded light diffuser along the axis through the flat surface, and wherein a second portion of the light that enters the molded light diffuser at an angle to the axis is redirected towards the ambient light sensor by the angled surface as the second portion exits the molded light diffuser.

12. The electronic device defined in claim 11, wherein a first angled surface of a first flat-topped cone with a circular base in the array meets a second angled surface of a second flat-topped cone with a circular base in the array at a point on the second surface.

13. The electronic device defined in claim 11, wherein the molded light diffuser comprises mounting clips that extend from the planar surface, and wherein the array of molded protrusions and the mounting clips are integrally formed as a single plastic member.

14. A light sensor, comprising:
   a light sensor housing;
   a photodetector in the light sensor housing, wherein the light sensor housing comprises a rear portion on which the photodetector is mounted and housing walls that extend from the rear portion to surround the photodetector; and
   a molded light diffuser that diffuses light passing to the photodetector, wherein the molded light diffuser has a first surface with molded flat-topped protrusions through which the light exits the molded light diffuser and a second surface opposite the first surface that defines a first plane through which the light enters the molded light diffuser, wherein each molded flat-topped protrusion has an angled surface and a flat surface, wherein a first portion of the light that enters the molded light diffuser along an axis exits the molded light diffuser along the axis through the flat surface, and wherein a second portion of the light that enters the molded light diffuser at an angle to the axis is redirected towards the photodetector by the angled surface as the second portion exits the molded light diffuser.

15. The light sensor defined in claim 14 wherein the molded flat-topped protrusions comprise flat-topped cones.

16. The light sensor defined in claim 15 wherein the light diffuser includes molded clips.

17. The light sensor defined in claim 14, wherein the molded light diffuser comprises alignment holes in the first surface and the light sensor housing comprises alignment protrusions that extend into the alignment holes to mount the molded light diffuser to the light sensor housing.

* * * * *